United States Patent
Lee

(10) Patent No.: US 9,419,123 B1
(45) Date of Patent: Aug. 16, 2016

(54) FIELD EFFECT POWER ELECTRONIC DEVICE AND METHOD FOR FABRICATING THE SAME

(71) Applicant: ELECTRONICS AND TELECOMMUNICATIONS RESEARCH INSTITUTE, Daejeon (KR)

(72) Inventor: Jong Min Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/803,877

(22) Filed: Jul. 20, 2015

(30) Foreign Application Priority Data

Mar. 18, 2015 (KR) ........................ 10-2015-0037280

(51) Int. Cl.
| | | |
|---|---|---|
| H01L 29/778 | (2006.01) | |
| H01L 29/66 | (2006.01) | |
| H01L 29/10 | (2006.01) | |
| H01L 21/265 | (2006.01) | |

(52) U.S. Cl.
CPC .......... *H01L 29/7786* (2013.01); *H01L 21/265* (2013.01); *H01L 29/1029* (2013.01); *H01L 29/66431* (2013.01)

(58) Field of Classification Search
None
See application file for complete search history.

(56) References Cited

U.S. PATENT DOCUMENTS

| | | | |
|---|---|---|---|
| 2009/0224311 A1 | 9/2009 | Hashitani | |
| 2009/0250750 A1* | 10/2009 | Takemori | H01L 29/1095 257/334 |
| 2012/0244658 A1 | 9/2012 | Koezuka et al. | |
| 2013/0049107 A1 | 2/2013 | So | |
| 2013/0175614 A1 | 7/2013 | Na | |
| 2013/0313637 A1* | 11/2013 | Yoshida | H01L 27/088 257/334 |
| 2014/0103539 A1 | 4/2014 | Min et al. | |

FOREIGN PATENT DOCUMENTS

KR   10-2010-0078859 A    7/2010

* cited by examiner

*Primary Examiner* — Yasser A Abdelaziez
(74) *Attorney, Agent, or Firm* — Rabin & Berdo, P.C.

(57) ABSTRACT

In a method for fabricating a field effect power electronic device, an epi layer is formed on a substrate defined by a device isolation area and a device operation area. A mask pattern is formed which covers the epi layer in the device operation area and has openings positioned at a predetermined distance along a first direction. An inside of the epi layer having the mask pattern formed thereon is formed as an active area, and a non-active area is formed by implanting ions into an inside of the epi layer having the mask pattern not formed thereon. The mask pattern is removed. Source and drain electrodes are formed, in a second direction, on the epi layer in the device operation area with the non-active area interposed therebetween. A gate electrode is formed on the epi layer in the device operation area between the source electrode and the drain electrode.

17 Claims, 6 Drawing Sheets

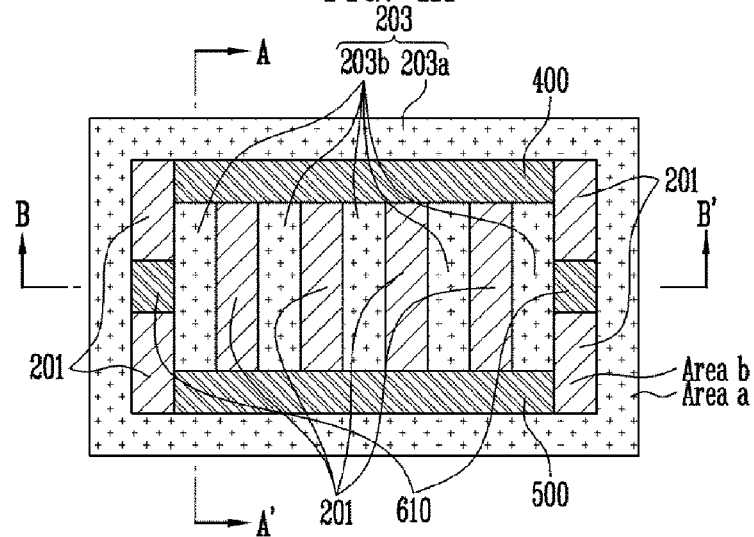
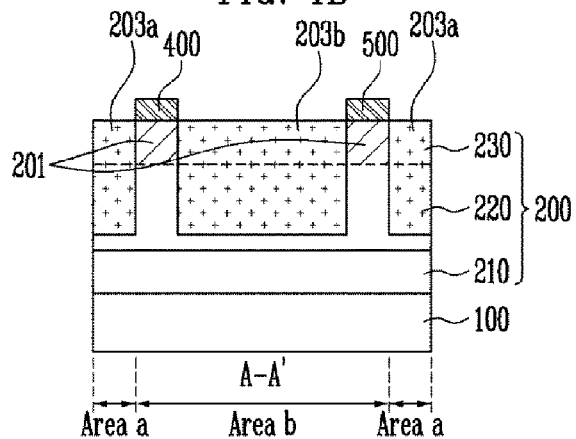
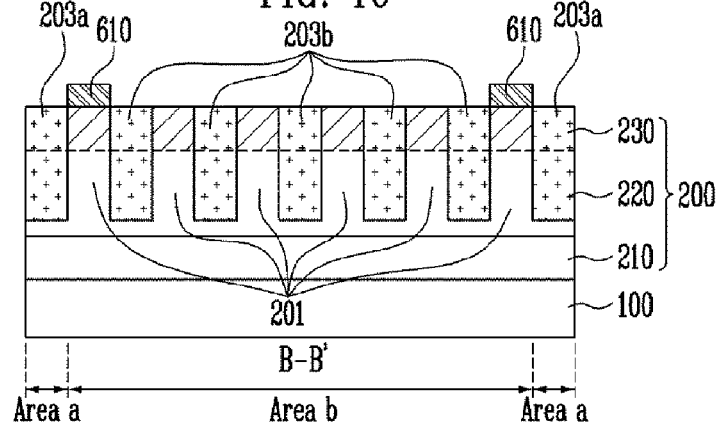

FIELD EFFECT POWER ELECTRONIC DEVICE AND METHOD FOR FABRICATING THE SAME

CROSS-REFERENCE TO RELATED APPLICATION

The present application claims priority to Korean patent application number 10-2015-0037280 filed on Mar. 18, 2015, in the Korean Intellectual Property Office, the entire disclosure of which is incorporated by reference herein.

BACKGROUND

1. Field

An aspect of the present invention relates to a semiconductor device, and more particularly, to a field effect power electronic device.

2. Description of the Related Art

The development of various forms of wireless communication technologies and semiconductor technologies has remarkably changed modern society and has provided various conveniences. This technology development started with the development of semiconductor devices in the early 20th century. All current electronic products and communication products include various electronic devices.

In order to put such electronic products and communication products as final products in the market, reliability of the products should be measured. The reliability of the measured products should satisfy a certain level of standard such that the products have commercial values. The reliability indicates possibility that a test sample will perform required functions for a given period of time under a given condition. Here, the sample may include a single item, a component, a device, a subsystem, a function unit, equipment, or a system.

An electronic device, particularly a high-power electronic device which produces a high output may be frequently used in a power amplifier. The power amplifier may be not only a most important component in a communication system but also a component having the highest price. Accordingly, many researches on characteristics and reliability of the power electronic device constituting the power amplifier have recently conducted and attracted great interest from developers. In addition, the power electronic device also forms the largest commercial market. The power amplifier has come into the spotlight as the most important core device not only in wireless communication such as fourth generation long term evolution (LTE) communication in recent years and fifth generation communication in future but also in military components such as radar.

The power electronic device is an electronic device which is applied to the power amplifier and produces the highest output at a transmitting/receiving terminal. Particularly, characteristic indexes representing characteristics of the power electronic device are output power, output gain, P1dB, efficiency, and the like. Among these characteristic indexes, the output power may be used as a reference for classifying power electronic devices. That is, the output power may be defined as power that a power electronic device can output as the power of the power electronic device is saturated. In order to increase the output power, the structure of a device may be defined by connecting a plurality of power electronic devices in parallel. However, due to a limit of real power electronic devices, there is a limitation in increase of output power even though a plurality of power electronic devices are connected, thereby resulting in a rapid decrease in power gain. Therefore, the size of the power electronic device cannot continuously increase.

Generally, a field effect power electronic device may be frequently used as the power electronic device. The field effect power electronic device may include a source, a drain, and a gate, and has characteristics of high output and high frequency. Thus, the field effect power electronic device is most frequently used as a radio frequency (RF) power electronic device. Here, the source of the field effect power electronic device may be grounded, and the gate and the drain may operate as an input terminal and an output terminal, respectively. The characteristics of the field effect power electronic device may be influenced by an epilayer constituting the device or a unit value of the structure of the device. Particularly, RF characteristics of the field effect power electronic device may influenced by a distance between the source and the gate or a distance between the gate and the drain. Therefore, in order to achieve optimal characteristics of the field effect power electronic device, an optimal structure of the device should be determined through many researches.

In order to produce sufficient output power, the power consumed in a power electronic device may be influenced by efficiency. When a real power electronic device operates, the percentage of output power to DC power applied to the device may be defined as efficiency. Here, most DC power that does not output as the output power is transformed into heat to be diffused to the outside of the power electronic device.

Since much heat may be generated inside the power electronic device, the reliability and durability of the power electronic device may be determined according to how much heat is diffused from the inside to the outside of the power electronic device. Particularly, in the case of the field effect power electronic device, heat generated inside the device increases temperature, which may have influence on the mobility of carriers. That is, if the temperature of the field effect power electronic device having high-frequency characteristics increases, the speed of the carriers decreases, and therefore, the high-frequency characteristics may be deteriorated corresponding to the increase in temperature.

As described above, in the power electronic device, the internal temperature and the diffusion of the heat from the inside to the outside are very important in the reliability and durability of the power electronic device, and many researches for solving such a problem have recently been conducted.

Particularly, when the field effect power electronic device operates as the movement of carriers is performed in a channel layer, the temperature in the channel layer may be highest.

The size of the field effect power electronic device may be defined as the width of the entire gate. Thus, the field effect power electronic device can generate high output power by increasing its size, i.e., the width of the gate. However, as the size of the field effect power electronic device, i.e., the width of the gate increases, heat generated inside the field effect power electronic device is not easily diffused to the outside. Hence, the internal temperature of the field effect power electronic device may further increase.

The field effect power electronic device may be fabricated as a multi-gate type field effect power electronic device having a plurality of gates. In the multi-gate type field effect power electronic device, heats generated from the gates have influence on each other, which may not only further increase the temperature of the field effect power electronic device but also generate hot spots. Particularly, the hot spot generated inside the field effect power electronic device rapidly deteriorates characteristics of the field effect power electronic device. As a result, the field effect power electronic device may be broken.

Accordingly, the problem that heat is generated inside the field effect power electronic device should be solved so as to improve the reliability and durability of the field effect power electronic device.

SUMMARY

Embodiments provide a method for fabricating a field effect power electronic device having improved reliability and durability.

Embodiments also provide a field effect power electronic device having improved reliability and durability.

According to an aspect of the present invention, there is provided a method for fabricating a field effect power electronic device, the method including: forming an epi layer on a substrate defined by a device isolation area and a device operation area; forming a mask pattern which covers the epi layer in the device operation area and has openings positioned at a predetermined distance along a first direction; forming an inside of the epi layer having the mask pattern formed thereon as an active area, and forming a non-active area by implanting ions into an inside of the epi layer having the mask pattern not formed thereon; removing the mask pattern; forming, in a second direction intersecting the first direction, a source electrode and a drain electrode on the epi layer in the device operation area with the non-active area, which is formed inside the epi layer in the device operation area, interposed therebetween; and forming a gate electrode on the epi layer in the device operation area between the source electrode and the drain electrode.

The active area the non-active area may be alternately formed in the epi layer in the device operation area.

The forming of the epi layer may include forming a transition layer on the substrate; forming a buffer layer on the transition layer; and forming a barrier layer on the buffer layer.

The non-active area may be formed down to the buffer layer while traversing the barrier layer.

The non-active area may include a first non-active area formed inside the epi layer in the device isolation area; and second non-active areas formed inside the epi layer in the device operation area.

The first non-active area may surround the epi layer in the device operation area.

The openings may be formed at a predetermined distance or different distances.

The openings may be formed to the same width and length or different widths and lengths.

In the forming of the inside of the epi layer having the mask pattern formed thereon as the active area and forming the non-active area by implanting the ions into the inside of the epi layer having the mask pattern not formed thereon, the non-active area may be formed by implanting ions for non-activating an area of a device into the inside of the epi layer having the mask pattern not formed thereon through an implant process.

The implanted ions may include phosphorus ions.

According to another aspect of the present invention, there is provided a field effect power electronic device, including: an epi layer formed on a substrate defined by a device isolation area and a device operation area; a source electrode and a drain electrode formed to be spaced apart from each other in a first direction on the epi layer in the device operation area; and a gate electrode formed between the source electrode and the drain electrode on the epi layer in the device operation area, wherein an active area and a non-active area alternately positioned in a second direction intersecting the first direction between the source electrode and the drain electrode are formed in the epi layer in the device operation area.

The epi layer may include a transition layer, a buffer layer, and a barrier layer, which are sequentially formed on the substrate.

The non-active area may be formed down to the buffer layer while traversing the barrier layer.

The non-active area may include a first non-active area formed inside the epi layer in the device isolation area; and second non-active areas formed inside the epi layer in the device operation area. The first non-active area may surround the epi layer in the device operation layer.

The first non-active area and the second non-active areas may include phosphorus ions.

The active area and the non-active area may be alternately positioned at a predetermined distance or different distances.

The active area and the non-active area may have the same width and length or different widths and lengths.

In the field effect power electronic device and the method for fabricating the same according to the present invention, the device operation area is distributed by forming the non-active area in the device operation area, so that it is possible to improve the reliability of the field effect power electronic device.

In the field effect power electronic device and the method for fabricating the same according to the present invention, it is possible to considerably increase thermal diffusion in the field effect power electronic device. Further, it is possible to prevent a rapid increase in temperature inside the field effect power electronic device due to thermal coupling.

In the field effect power electronic device and the method for fabricating the same according to the present invention, a device isolation process used in the existing field effect power electronic devices is used to form the non-active area in the device operation area, so that any additional semiconductor device or mask is not required.

In the field effect power electronic device and the method for fabricating the same according to the present invention, it is possible to fabricate a high-reliability field effect power electronic device.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 1A, 1B, 1C, 2A, 2B, 2C, 3A, 3B, 3C, 4A, 4B, 4C, 5A, 5B and 5C are views illustrating a method for fabricating a field effect power electronic device according to an embodiment of the present invention.

DETAILED DESCRIPTION

Figure 1A:
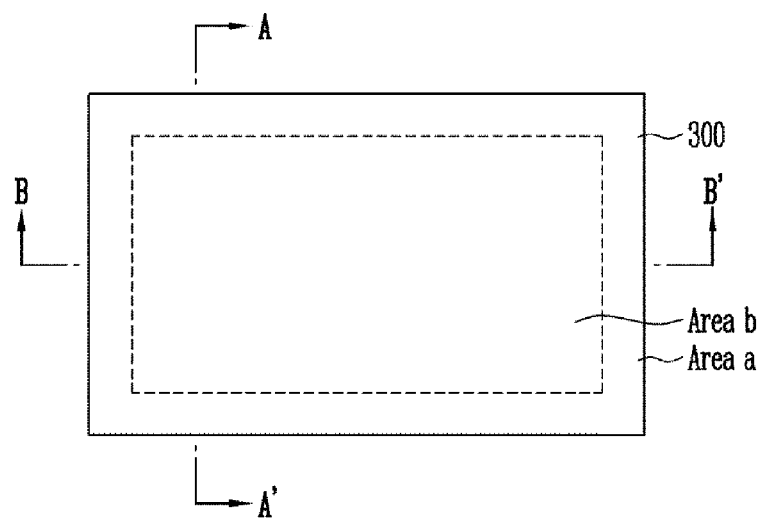

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

In this specification, when a layer is "on" another layer or a substrate, the layer may be directly formed on another layer or the substrate, or there may be a third layer disposed therebetween. Also, directional expressions such as top (or upper portion), surface, or the like may be understood as bottom, bottom portion, bottom surface, or the like. Hence, spatial expressions should be understood to be relative and should not be construed to be limited to absolute directions. In addition, it will be understood that, although the terms first, second, etc. may be used herein to describe various elements, these elements should not be limited by these terms. These terms may be used to distinguish one element from another element. For example, a first element discussed below could be termed a second element without departing from the teachings of the present invention.

In this specification, thicknesses of layers or areas illustrated in the drawings are exaggerated for clarity of description. Throughout the specification, like reference numerals refer to like elements.

Hereinafter, a method for fabricating a field effect power electronic device according to an embodiment of the present invention will be described with reference to the accompanying drawings.

FIGS. 1A, 1B, 1C, 2A, 2B, 2C, 3A, 3B, 3C, 4A, 4B, 4C, 5A, 5B and 5C are views illustrating a method for fabricating a field effect power electronic device according to an embodiment of the present invention.

For simplicity and clearness of illustration, FIGS. 1A, 1B, 1C, 2A, 2B, 2C, 3A, 3B, 3C, 4A, 4B, 4C, 5A, 5B and 5C illustrate a method for fabricating a field effect power electronic device having one source, one drain, and one gate. However, the present invention is not limited thereto, and a field effect power electronic device having a plurality of sources, a plurality of drains, and a plurality of gates may be fabricated through a method for fabricating a field effect power electronic device according to an embodiment of the present invention.

Figure 1B:
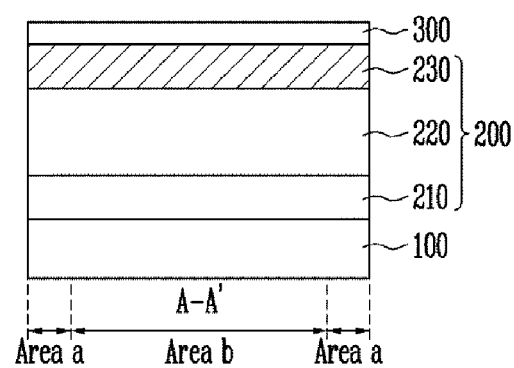
Figure 1C:
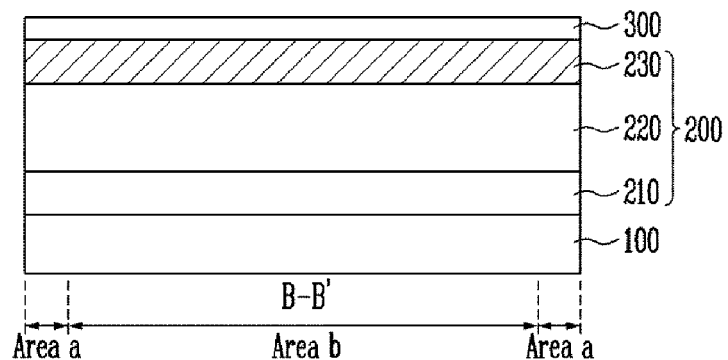

FIGS. 1A, 1B and 1C are views illustrating a method of sequentially forming an epi layer and a mask film on a substrate. FIG. 1A is a plan view, viewed from the top, of the field effect power electronic device in which the epi layer and the mask film are sequentially formed on a substrate. FIG. 1B is a sectional view taken along line A-A' of FIG. 1A. FIG. 1C is a sectional view taken along line B-B' of FIG. 1A.

Referring to FIGS. 1A, 1B and 1C, an epi layer 200 may first be formed on a substrate 100 defined by a device isolation area Area a and a device operation area Area b. That is, the method for fabricating the field effect power electronic device according to the embodiment of the present invention may start with the completion of the growth of the epi layer 200 on the substrate 100.

The substrate 100 may include a semiconductor substrate such as Si, SiC, GaAs, GaN, GaP or InP, a metal substrate such as Cu or W, or a sapphire substrate. The substrate 100 is not limited to the substrates made of the materials described above, and any substrate may be used as the substrate 100 as long as it is a substrate made of a material which can facilitate the growth of the epi layer 200 to be described later.

The epi layer 200 is an epitaxial layer, and its deposition process is referred to as epitaxy. The epi layer 200 may include a transition layer 210, a buffer layer 220, and a barrier layer 230. That is, the transition layer 210, the buffer layer 220, and the barrier layer 230, which are used for the growth of the epi layer 200, may be sequentially formed on the substrate 100. First, the transition layer 210 may be formed on the substrate 100. Subsequently, the buffer layer 220 may be formed on the transition layer 210. Subsequently, the barrier layer 230 may be formed on the buffer layer 220.

The transition layer 210 may be formed on the substrate 100. The transition layer 210 can reduce lattice mismatching caused by a difference in lattice constant between the substrate 100 and the buffer layer 220 to be described later. The transition layer 210 may include GaN, AlN or AlGaN, but the present invention is not limited thereto. The transition layer 210 may be omitted. The transition layer 210 may be thickly formed on the substrate 100.

The buffer layer 220 may be formed on the transition layer 210. When the transition layer 210 is omitted, the buffer layer 220 may be formed on the substrate 100. The buffer layer 220 may be an undoped semiconductor layer, but the present invention is not limited thereto. The buffer layer 220 may be a semiconductor layer doped with an impurity. The buffer layer 220 may be formed of a semiconductor compound. That is, the buffer layer 220 may be formed of a semiconductor compound of Group III-V or Group II-VI. The buffer layer 220 may include at least one of GaN, InN, AlN, InGaN, AlGaN, InAlGaN, AlInN, AlGaAs, InGaAs, AlInGaAs, GaP, AlGaP, InGaP, AlInGaP, and InP, but the present invention is not limited thereto.

The barrier layer 230 may be formed on the buffer layer 220. The barrier layer 230 may be formed of a semiconductor compound. That is, the barrier layer 230 may be formed of a semiconductor compound of Group III-V or Group II-VI. The barrier layer 230 may include at least one of GaN, InN, AlN, InGaN, AlGaN, InAlGaN, AlInN, AlGaAs, InGaAs, AlInGaAs, GaP, AlGaP, InGaP, AlInGaP, and InP, but the present invention is not limited thereto. Particularly, if the field effect power electronic device according to the embodiment of the present invention is an AlGaN/GaN power electronic device, the buffer layer 220 may include GaN, and the barrier layer 230 may include AlGaN.

The barrier layer 230 is a layer for helping the formation of a channel layer, and may function to bend the energy band of the channel layer. The channel layer is a layer in which carriers move, and may be formed between the buffer layer 220 and the barrier layer 230. The channel layer may be a spot where, in an operation of the temperature of the field effect power electronic device according to the embodiment, its temperature is highest.

After the epi layer 200 is formed, a mask film 300 may be formed on the entire surface on the epi layer 200. That is, the mask film 300 may be formed on the entire surface on the barrier layer 230 included in the epi layer 200. The mask film 300 may be a protective layer for protecting the epi layer 200. The mask film 300 may be used to define a device in a subsequent process. The mask film 300 may mainly include a silicon nitride (SiNx) film or a photoresist film.

Figure 2A:
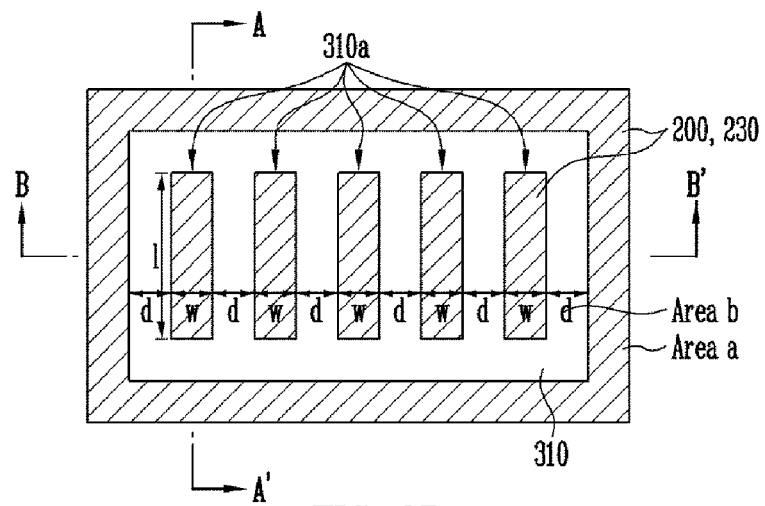
Figure 2B:
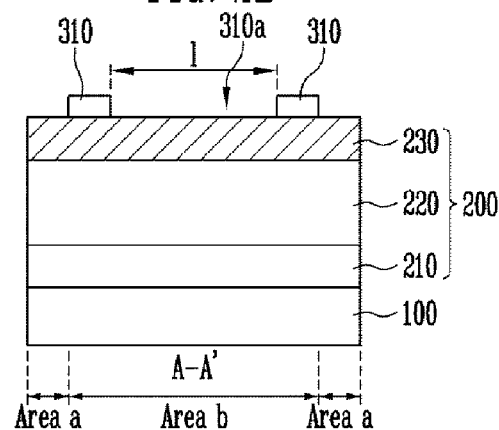
Figure 2C:
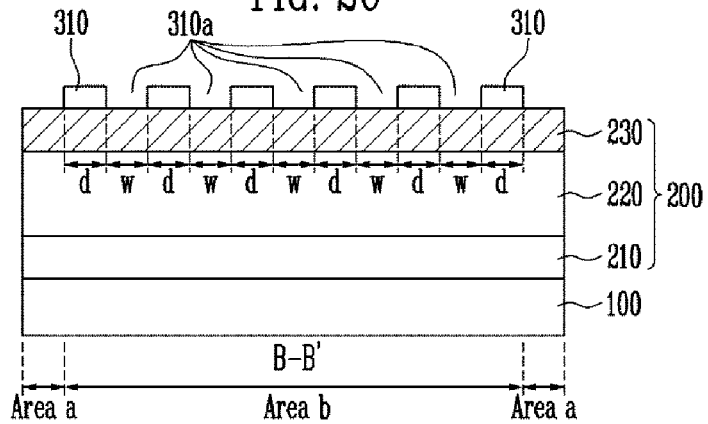

FIGS. 2A, 2B and 2C are views illustrating a method of forming a mask pattern. FIG. 2A is a plan view, viewed from the top, of the field effect power electronic device in which the mask pattern is formed. FIG. 2B is a sectional view taken along line A-A' of FIG. 2A. FIG. 2C is a sectional view taken along line B-B' of FIG. 2A.

Referring to FIGS. 2A, 2B and 2C, after the epi layer 200 described above in FIGS. 1A, 1B and 1C is formed, a mask pattern 310 may be formed by patterning the mask film 300 formed on the entire surface on the epi layer 200. That is, the mask pattern 310 may be formed by patterning the mask film 300 formed on the entire surface on the barrier layer 230 included in the epi layer 200. The mask pattern 310 may be formed through a general semiconductor process such as a dry etching process or a wet etching process.

The mask pattern 310 may cover the epi layer 200 in the device operation area Area b and have openings 310a. That is, the epi layer 200 corresponding to the device isolation area Area a may be exposed by removing the mask film 300 in the device isolation area Area from the mask film 300 formed on the entire surface on the epi layer 200. Also, the epi layer 200 corresponding to the openings 310a may be exposed by removing the mask film 300 corresponding to the openings 310a in the device operation area Area b.

The openings 310a may be positioned in the device operation area Area b. The openings 310a may be positioned at a predetermined distance d along a first direction. Here, the predetermined distance may be adjusted. As an example, the openings 310a may be positioned at a constant distance d along the first direction. As another example, the openings 310a may be positioned at different distances d along the first direction.

The openings 310a may have the same width w and length l or may have different widths and lengths w and l. That is, the width w and length l of the openings 310a may be adjusted. Therefore, the openings 310a may have the same area or may have different areas. For example, the area of the opening 310a positioned near a central portion of the device operation area Area b may be different from that of the opening 310a positioned near an edge portion of the device operation area Area b. The openings 310a may have a quadrangular shape as shown in these figures, but the present invention is not limited thereto.

Figure 3A:
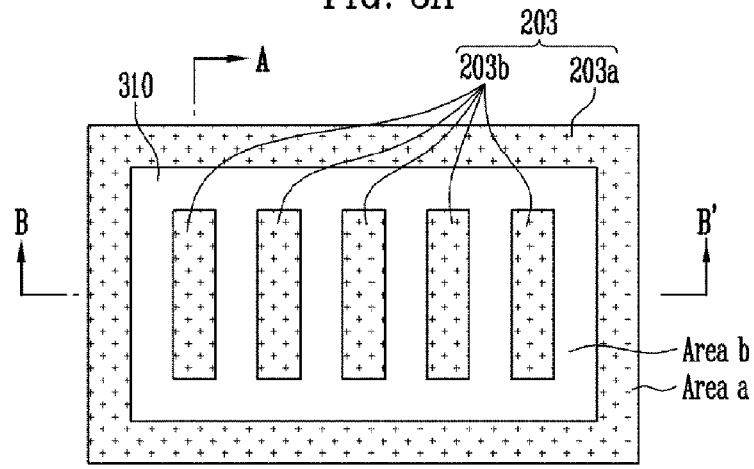
Figure 3B:
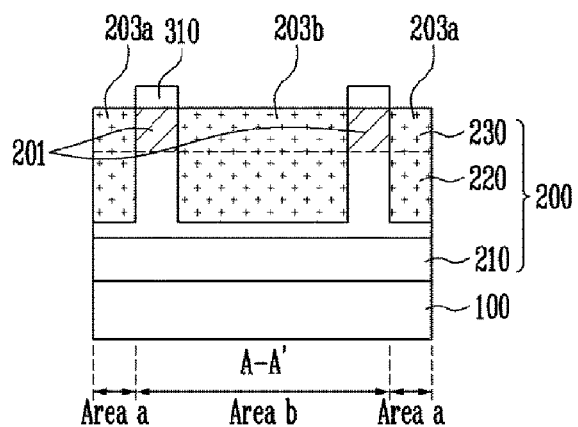
Figure 3C:
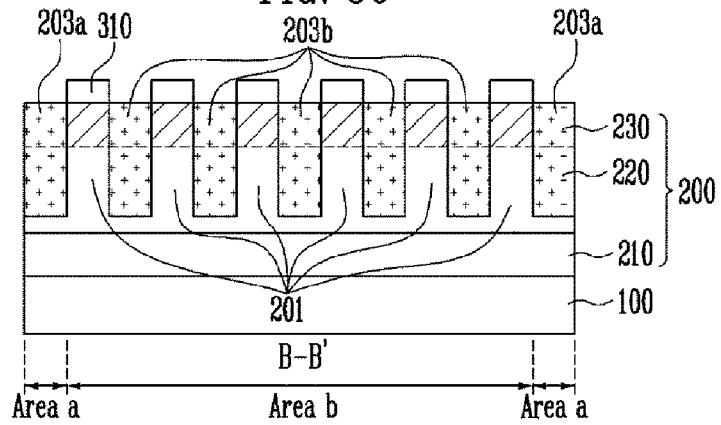

FIGS. 3A, 3B and 3C are views illustrating a method of forming an active area and a non-active area in the epi layer. FIG. 3A is a plan view, viewed from the top, of the field effect power electronic device in which the active area and the non-active area are formed in the epi layer. FIG. 3B is a sectional view taken along line A-A' of FIG. 3A. FIG. 3C is a sectional view taken along line B-B' of FIG. 3A.

Referring to FIGS. 3A, 3B and 3C, after the mask pattern 310 described above in FIGS. 2A, 2B and 2C is formed, an active area 201 and a non-active area 203 may be formed in the epi layer 200. That is, the inside of the epi layer 200 having the mask pattern 310 formed thereon may be formed as the active area 201, and the inside of the epi layer 200 having the mask pattern 310 not formed thereon may be formed as the non-active area 203.

For example, the inside of the epi layer 200, which is not protected by the mask pattern 310 but exposed to the outside, may be implanted with ions through an implant process, thereby forming the non-active area 203. On the other hand, the inside of the epi layer 200, which is protected by the mask pattern 310, may not be implanted with any ion, thereby forming the active area 201. Therefore, the active area 201 and the non-active area 203 may be alternately formed in the epi layer 200 in the device operation area Area b. Here, the non-active area 203 may be a second non-active area 203b to be described later.

The ion implantation is a doping technique in which a semiconductor layer is implanted with ions accelerated at high speed by an electric field. Various types of ions may be implanted, but ions for non-activating an area of a device are used as the implanted ions in the present invention. Therefore, the implanted ions may include phosphorus ions.

The non-active area 203 may include a first non-active area 203a and second non-active areas 203b. The first non-active area 203a may be formed by implanting ions into the epi layer 200 corresponding to the device isolation area Area a through an implant process. The first non-active area 203a may surround the epi layer 200 in the device operation area Area b. The second non-active area 203b may be formed by implanting ions into the epi layer 200 corresponding to the openings 310 in the device operation area Area b through the implant process.

The non-active area 203 may be formed down to the buffer layer 220 while traversing the barrier layer 230. The non-active area 203 may be formed to be spaced apart from the transition layer 210. That is, the non-active area 203 may be formed to a depth smaller than the total thickness of the barrier layer 230 and the buffer layer 220 so that transition layer 201 is not exposed in the bottom surface of the non-active area 203. If the transition layer 210 is omitted, the non-active area 203 may be formed to be spaced apart from the substrate 100.

In order to operate a real field effect power electronic device as a single device, it is essential to isolate the device from another device. Therefore, an etching or implant process is to be performed on the outside defined as an operation area of the device for the purpose of isolation. Generally, there are several materials for implant, and the materials are used in doping. However, in the method for fabricating the field effect power electronic device according to the embodiment of the present invention, the material for implant is use to non-activate an area of the device. Particularly, a material such as phosphorus may be used as the material for implant.

The first non-active area 203a may be the device isolation area Area a for isolating the device operation area Area b. In the method for fabricating the field effect power electronic device according to the embodiment of the present invention, non-active areas (device isolation areas) used in the existing field effect power electronic devices can be formed at a predetermined distance even in the device operation area Area b. That is, the second non-active areas 203b for non-activating the operation of the device can be formed in the device operation area Area b.

As described above, in the method for fabricating the field effect power electronic device according to the embodiment of the present invention, the device operation area is distributed by forming the non-active area in the device operation area, so that the reliability of the field effect power electronic device can be improved. That is, the device operation area is divided into the active area and the non-active area, so that heat generated in the field effect power electronic device can be diffused. This can considerably increase thermal diffusion in the field effect power electronic device, and can prevent a rapid increase in temperature inside the field effect power electronic device due to thermal coupling.

Further, in the method for fabricating the field effect power electronic device according to the embodiment of the present invention, a device isolation process used in the existing field effect power electronic devices is used to form the non-active area in the device operation area, so that any additional semiconductor device or mask is not required.

Further, in the method for fabricating the field effect power electronic device according to the embodiment of the present invention, a high-reliability field effect power electronic device can be fabricated.

FIGS. 4A, 4B and 4C are views illustrating a method of forming a source electrode and a drain electrode on the epi layer in the device operation area. FIG. 4A is a plan view, viewed from the top, of the field effect power electronic device in which the source electrode and the drain electrode are formed on the epi layer in the device operation area. FIG. 4B is a sectional view taken along line A-A' of FIG. 4A. FIG. 4C is a sectional view taken along line B-B' of FIG. 4A.

Referring to FIGS. 4A, 4B and 4C, after the implant process described above in FIGS. 3A, 3B and 3C, i.e., after the active area 201 and the non-active area 203 are formed in the epi layer 200, the mask pattern 310 formed in the device operation area Area b may be removed.

Subsequently, a lithography process for forming an ohmic electrode may be performed. The ohmic electrode may be formed on the epi layer 200 in the device operation area Area b. The ohmic electrode may include a source electrode 400 and a drain electrode 500. The ohmic electrode may further include gate pads 610.

The source electrode 400 and the drain electrode 500 may be formed, in a second direction intersecting the first direction, on the epi layer 200 in the device operation area Area b with the non-active areas formed inside the epi layer 200 in the device operation area Area b, i.e., the second non-active areas 203b, interposed therebetween. That is, the second non-active areas 203b may be positioned in the epi layer 200 between the source electrode 400 and the drain electrode 500 in the first direction. Therefore, the active area 201 and the non-active area 203b may be alternately positioned in the epi layer 200 between the source electrode 400 and the drain electrode 500.

The source electrode 400 and the drain electrode 500 may be formed on only the active area 201 in the device operating area Area b, but the present invention is not limited thereto. As shown in these figures, the source electrode 400 and the drain electrode 500 may be formed to extend on the second non-active areas 203b in addition to the active area 201 in the device operation area Area b.

The second direction may mean a length direction in which current flows from the drain electrode 500 to the source electrode 400, and the first direction may means a direction perpendicular to the second direction.

The gate pad 610 may be formed on the epi layer 200 in the device isolation area Area a next to the second non-active area 203b formed at an outermost portion in the device operation area Area b, i.e., on the active area 201.

Figure 5A:
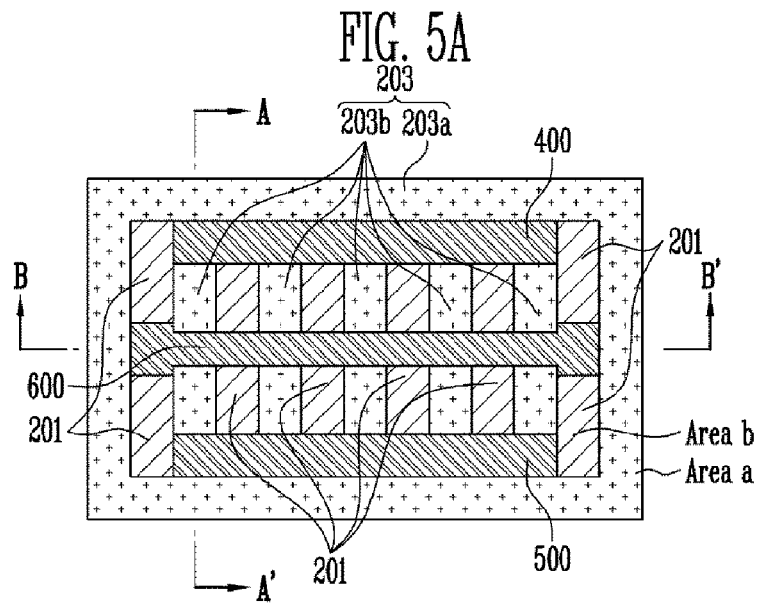
Figure 5B:
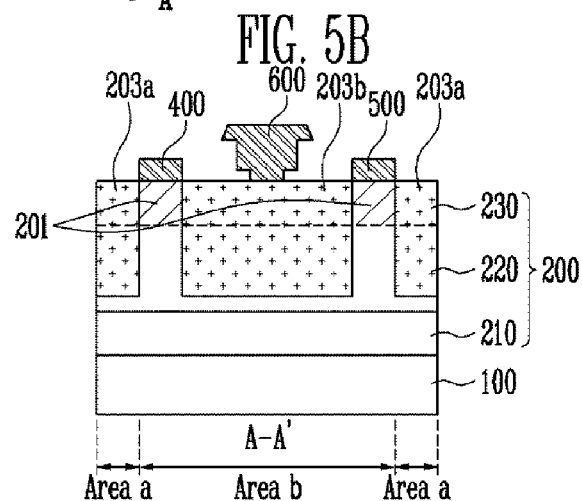
Figure 5C:
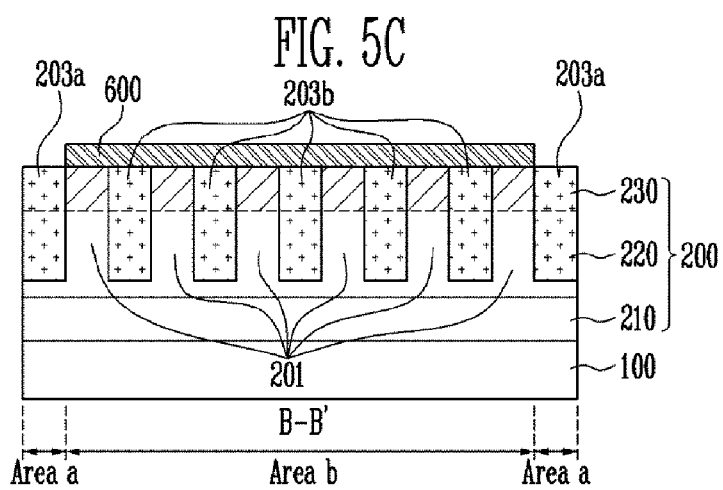

FIGS. 5A, 5B and 5C are views illustrating a method of forming a gate electrode on the epi layer in the device operation area. FIG. 5A is a plan view, viewed from the top, of the field effect power electronic device in which the gate electrode is formed on the epi layer in the device operation area. FIG. 5B is a sectional view taken along line A-A' of FIG. 5A. FIG. 5C is a sectional view taken along line B-B' of FIG. 5A.

Referring to FIGS. 5A, 5B and 5C, after the source and drain electrodes 400 and 500 described above in FIGS. 4A, 4B and 4C are formed, a lithography process for forming a gate electrode 600 may be performed. That is, the gate electrode 600 may be formed through a semiconductor process using the mask film 300.

The gate electrode 600 may be formed between the source electrode 400 and the drain electrode 500. The gate electrode 600 may be formed on the epi layer 200 in the device operation area Area b. That is, the gate electrode 600 may be formed to traverse, in the first direction, the second non-active areas 203b and the active area 201 on the epi layer 200 in the device operation area Area b between the source electrode 400 and the drain electrode 500. As shown in these figures, when the gate pad 610 is formed on the epi layer 200 in the device isolation area Area a next to the second non-active area 203b formed at the outermost portion in the device operation area Area b, i.e., on the active area 201, the gate electrode 600 may be formed to connect the gate pads 610 to each other while traversing the second non-active areas 203b and the active area 201 in the first direction.

After the gate electrode 600 is formed, an insulating layer may be formed using an insulating film (not shown) for insulation of the device. The insulating film (not shown) may include a silicon nitride (SiNx) film.

In the method for fabricating the field effect power electronic device according to the embodiment of the present invention, a high-reliability field effect power electronic device can be fabricated using a simple method. That is, the reliability of the field effect power electronic device is most important when the field effect power electronic device is used in a circuit such as a real amplifier. Thus, the method for fabricating the field effect power electronic device according to the embodiment of the present invention proposes a method capable of improving the reliability of the field effect power electronic device.

Further, the method for fabricating the field effect power electronic device according to the embodiment of the present invention proposes a method capable of solving the problem of heat generated in the field effect power electronic device, which has most influence on the reliability of the field effect power electronic device. That is, in the method for fabricating the field effect power electronic device according to the embodiment of the present invention, the existing device isolation process can be introduced to the inside of the device as it is, thereby fabricating a field effect power electronic device having improved reliability. The method for fabricating the field effect power electronic device according to the embodiment of the present invention is not problematic in terms of cost because any additional semiconductor process or mask is not required. Also, the method for fabricating the field effect power electronic device according to the embodiment of the present invention can simply achieve a great effect.

Hereinafter, a field effect power electronic device according to an embodiment of the present invention will be described with reference to the accompanying drawing. Particularly, the field effect power electronic device according to the embodiment of the present invention is fabricated by the method described above with reference to FIGS. 1A, 1B, 1C, 2A, 2B, 2C, 3A, 3B, 3C, 4A, 4B, 4C, 5A, 5B and 5C, and therefore, portions overlapping with the method will be omitted for simplicity and clearness of illustration.

Figure 6:
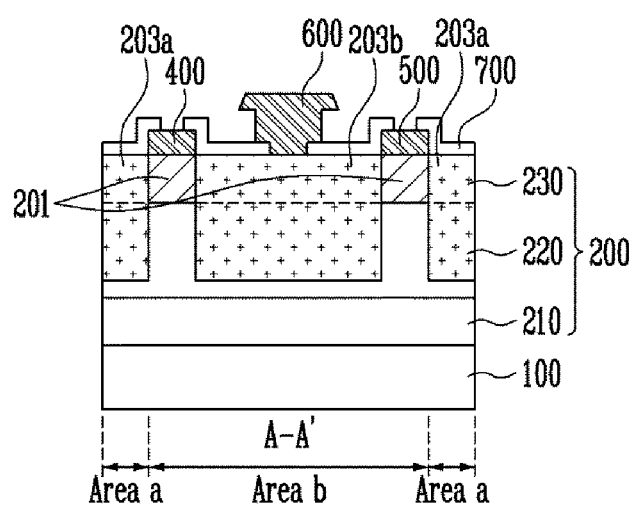
FIG. 6 is a sectional view illustrating a field effect power electronic device according to an embodiment of the present invention.

FIG. 6 is a sectional view illustrating a field effect power electronic device according to an embodiment of the present invention.

For simplicity and clearness of illustration, FIG. 6 illustrates a field effect power electronic device having one source, one drain, and one gate. However, the present invention is not limited thereto, and the field effect power electronic device according to the embodiment of the present invention may include a parallel field effect power electronic device having a plurality of sources, a plurality of drains, and a plurality of gates, which are connected in parallel.

Referring to FIG. 6, the field effect power electronic device according to the embodiment of the present invention includes a substrate 100, an epi layer 200, a source electrode 400, a drain electrode 500, and a gate electrode 600.

The substrate 100 is the same as the substrate 100 described with reference to FIGS. 1A, 1B and 1C, and therefore, description of the substrate 100 will be omitted for simplicity and clearness of illustration.

The epi layer 200 may be positioned on the substrate 100 defined by a device isolation area Area a and a device operation area Area b. The epi layer 200 may includes a transition layer 210, a buffer layer 220, and a barrier layer 230. That is, the transition layer 210, the buffer layer 220, and the barrier layer 230, which are used for the growth of the epi layer 200, may be sequentially positioned on the substrate 100. The transition layer 210 may be positioned on the substrate 100. The buffer layer 220 may be formed on the transition layer 210. The barrier layer 230 may be formed on the buffer layer 220.

The epi layer 200, the transition layer 210, the buffer layer 220, and the barrier layer 230 respectively correspond to the epi layer 200, the transition layer 210, the buffer layer 220, and the barrier layer 230, which are described above with reference to FIGS. 1A, 1B and 1C, and therefore, their detailed descriptions will be omitted.

The source electrode 400 and the drain electrode 500 may be positioned to be spaced apart from each other in a first direction on the epi layer 200 in a device operation area Area b. Here, the first direction means the second direction described above in FIGS. 1A, 1B, 1C, 2A, 2B, 2C, 3A, 3B, 3C, 4A, 4B, 4C, 5A, 5B and 5C, and the following second direction means the first direction described above in FIGS. 1A, 1B, 1C, 2A, 2B, 2C, 3A, 3B, 3C, 4A, 4B, 4C, 5A, 5B and 5C. That is, the first direction may mean a length direction in which current flows from the drain electrode 500 to the source electrode 400, and the second direction may means a direction perpendicular to the first direction.

The gate electrode 600 may be positioned between the source electrode 400 and the drain electrode 500 on the epi layer 200 in the device operation area Area b.

The source electrode 400, the drain electrode 500, and the gate electrode 600 respectively correspond to the source electrode 400, the drain electrode 500, and the gate electrode 600, which are described above with reference to FIGS. 4A, 4B, 4C, 5A, 5B and 5C, and therefore, their detailed descriptions will be omitted.

An insulating layer 700 for insulation of device may be positioned on the epi layer 200. The insulating layer 700 may be positioned to extend to the epi layer 200 in a device isolation area Area a and an upper surface of the source electrode 400. Also, the insulating layer 700 may be positioned to extend to the epi layer 200 in the device isolation area Area a and an upper surface of the drain electrode 500. Also, the insulating layer 700 may be positioned to extend to the epi layer 200 between the source electrode 400 and the gate electrode 600 and the upper surface of the source electrode 400. Also, the insulating layer 700 may be positioned to extend to the epi layer 200 between the drain electrode 500 and the gate electrode 600 and the upper surface of the drain electrode 500. The insulating layer 700 may include silicon nitride (SiNx).

Continuously referring to FIGS. 1A, 1B, 1C, 2A, 2B, 2C, 3A, 3B, 3C, 4A, 4B, 4C, 5A, 5B, 5C and 6, an active area 201 and a non-active area 203 may be positioned in the epi layer 200.

The active area 201 and the non-active area 203 may be formed through an implant process. That is, the inside of the epi layer 200 into which any ion is not implanted may be formed as the active area 210 through the implant process, and the inside of the epi layer 200 into which ions are implanted may be formed as the non-active area 203 through the implant process.

The ion implantation is a doping technique in which a semiconductor layer is implanted with ions accelerated at high speed by an electric field. Various types of ions may be implanted, but ions for non-activating an area of a device are used as the implanted ions in the present invention. Therefore, the implanted ions may include phosphorus ions.

The non-active area 203 may include a first non-active area 203a and second non-active areas 203b. The first non-active area 203a may be formed by implanting ions into the epi layer 200 corresponding to the device isolation area Area a through an implant process. The first non-active area 203a may surround the epi layer 200 in the device operation area Area b. The second non-active area 203b may be formed by implanting ions into the epi layer 200 corresponding to a portion in the device operation area Area b through the implant process.

The second non-active areas 203b may be positioned in the device operation area Area b. The second non-active areas 203b may be positioned at a predetermined distance along the first direction. As an example, the second non-active areas 203b may be positioned at a predetermined distance along the second direction. As another example, the second non-active areas 203b may be positioned at different distances along the second direction.

The second non-active areas 203b may have the same width and length or may have different widths and lengths. That is, the width and length of the second non-active areas 203b may be adjusted. Therefore, the second non-active areas 203b may have the same area or may have different areas. For example, the area of the second non-active area 203b positioned near a central portion of the device operation area Area b may be different from that of the second non-active area 203b positioned near an edge portion of the device operation area Area b.

That is, for convenience in this figure, the active area 201 and the second non-active areas 203b, which are positioned inside the epi layer 200 in the device operation area Area b, are disposed at a predetermined distance, but the maximum temperature of a real field effect power electronic device exists at a central portion of the device operation area Area b, where thermal diffusion is most difficult. Therefore, in the non-active area 203 according to the embodiment of the present invention, the area of the second non-active area 203b positioned near the central portion of the device operation area Area b may be set different from that of the second non-active area 203b positioned near the edge portion of the device operation area Area b.

The second non-active areas 203b may have a quadrangular shape as shown in this figure, but the present invention is not limited thereto.

The non-active area 203 may be formed down to the buffer layer 220 while traversing the barrier layer 230. The non-active area 203 may be formed to be spaced apart from the transition layer 210. That is, the non-active area 203 may be formed to a depth smaller than the total thickness of the barrier layer 230 and the buffer layer 220 so that transition layer 201 is not exposed in the bottom surface of the non-active area 203. If the transition layer 210 is omitted, the non-active area 203 may be formed to be spaced apart from the substrate 100.

In the field effect power electronic device according to the embodiment of the present invention, the active area 201 and the second non-active areas 203b, which are alternately positioned in the second direction intersecting the first direction between the source electrode 400 and the drain electrode 500, may be formed in the epi layer 200 in the device operation area Area b.

The source electrode 400 and the drain electrode 500 may be formed in the first direction on the epi layer 200 in the device operation area Area b with the non-active areas formed inside the epi layer 200 in the device operation area Area b, i.e., the second non-active areas 203b, interposed therebetween. That is, the second non-active areas 203b may be positioned in the epi layer 200 between the source electrode 400 and the drain electrode 500 in the first direction. Therefore, the active area 201 and the non-active area 203b may be alternately positioned in the epi layer 200 between the source electrode 400 and the drain electrode 500.

The source electrode 400 and the drain electrode 500 may be formed on only the active area 201 in the device operating area Area b, but the present invention is not limited thereto. As shown in this figure, the source electrode 400 and the drain electrode 500 may be formed to extend on the second non-active areas 203b in addition to the active area 201 in the device operation area Area b.

The gate electrode 600 may be positioned between the source electrode 400 and the drain electrode 500. The gate electrode 600 may be positioned on the epi layer 200 in the device operation area Area b. That is, the gate electrode 600 may be formed to traverse, in the second direction, the second non-active areas 203b and the active area 201 on the epi layer 200 in the device operation area Area b between the source electrode 400 and the drain electrode 500.

As shown in this figure, when a gate pad 610 is formed on the epi layer 200 in the device isolation area Area a next to the second non-active area 203b formed at an outermost portion in the device operation area Area b, i.e., on the active area 201, the gate electrode 600 may be formed to connect the gate pads 610 to each other while traversing the second non-active areas 203b and the active area 201 in the second direction. The gate pad 610 may be formed on the epi layer 200 in the device isolation area Area a next to the second non-active area 203b formed at the outermost portion in the device operation area Area b, i.e., on the active area 201.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a field effect power electronic device, the method comprising:
   forming an epi layer on a substrate defined by a device isolation area and a device operation area;
   forming a mask pattern which covers the epi layer in the device operation area and has openings positioned at a predetermined distance along a first direction;
   forming an inside of the epi layer having the mask pattern formed thereon as an active area, and forming a non-active area by implanting ions into an inside of the epi layer having the mask pattern not formed thereon;
   removing the mask pattern;
   forming, in a second direction intersecting the first direction, a source electrode and a drain electrode on the epi layer in the device operation area with the non-active area, which is formed inside the epi layer in the device operation area, interposed therebetween; and
   forming a gate electrode on the epi layer in the device operation area between the source electrode and the drain electrode.

2. The method of claim 1, wherein the active area and the non-active area are alternately formed in the epi layer in the device operation area.

3. The method of claim 1, wherein the forming of the epi layer includes:
   forming a transition layer on the substrate;
   forming a buffer layer on the transition layer; and
   forming a barrier layer on the buffer layer.

4. The method of claim 3, wherein the non-active area is formed down to the buffer layer while traversing the barrier layer.

5. The method of claim 1, wherein the non-active area includes:
   a first non-active area formed inside the epi layer in the device isolation area; and
   second non-active areas formed inside the epi layer in the device operation area.

6. The method of claim 5, wherein the first non-active area surrounds the epi layer in the device operation area.

7. The method of claim 1, wherein the openings are formed at a predetermined distance or different distances.

8. The method of claim 1, wherein the openings are formed to the same width and length or different widths and lengths.

9. The method of claim 1, wherein, in the forming of the inside of the epi layer having the mask pattern formed thereon as the active area and forming the non-active area by implanting the ions into the inside of the epi layer having the mask pattern not formed thereon, the non-active area is formed by implanting ions for non-activating an area of a device into the inside of the epi layer having the mask pattern not formed thereon through an implant process.

10. The method of claim 1, wherein the implanted ions include phosphorus ions.

11. A field effect power electronic device, comprising:
    an epi layer formed on a substrate defined by a device isolation area and a device operation area;
    a source electrode and a drain electrode formed to be spaced apart from each other in a first direction on the epi layer in the device operation area; and
    a gate electrode formed between the source electrode and the drain electrode on the epi layer in the device operation area,
    wherein an active area and a non-active area alternately positioned in a second direction intersecting the first direction between the source electrode and the drain electrode are formed in the epi layer in the device operation area.

12. The field effect power electronic device of claim 11, wherein the epi layer includes a transition layer, a buffer layer, and a barrier layer, which are sequentially formed on the substrate.

13. The field effect power electronic device of claim 11, wherein the non-active area is formed down to the buffer layer while traversing the barrier layer.

14. The field effect power electronic device of claim 11, wherein the non-active area includes:
    a first non-active area formed inside the epi layer in the device isolation area; and second non-active areas formed inside the epi layer in the device operation area, and wherein the first non-active area surrounds the epi layer in the device operation layer.

15. The field effect power electronic device of claim 14, wherein the first non-active area and the second non-active areas include phosphorus ions.

16. The field effect power electronic device of claim 11, wherein the active area and the non-active area are alternately positioned at a predetermined distance or different distances.

17. The field effect power electronic device of claim 11, wherein the active area and the non-active area have the same width and length or different widths and lengths.

* * * * *